(12) United States Patent
Ou et al.

(10) Patent No.: US 10,353,440 B2
(45) Date of Patent: Jul. 16, 2019

(54) HOUSING AND ELECTRONIC DEVICE USING THE SAME

(71) Applicants: SHENZHEN FUTAIHONG PRECISION INDUSTRY CO., LTD., Shenzhen (CN); FIH (HONG KONG) LIMITED, Kowloon (HK)

(72) Inventors: Wu-Zheng Ou, New Taipei (TW); Chang-Hai Gu, Shenzhen (CN); Chao-Hsun Lin, New Taipei (TW); Xiao-Kai Liu, Shenzhen (CN); Wei-Ben Chen, New Taipei (TW)

(73) Assignees: SHENZHEN FUTAIHONG PRECISION INDUSTRY CO., LTD., Shenzhen (CN); FIH (HONG KONG) LIMITED, Kowloon (HK)

( * ) Notice: Subject to any disclaimer, the term of this patent is extended or adjusted under 35 U.S.C. 154(b) by 0 days.

(21) Appl. No.: 15/481,480

(22) Filed: Apr. 7, 2017

(65) Prior Publication Data
US 2017/0212553 A1    Jul. 27, 2017

Related U.S. Application Data

(63) Continuation of application No. 14/607,500, filed on Jan. 28, 2015, now abandoned.

(30) Foreign Application Priority Data

Oct. 23, 2014   (CN) .......................... 2014 1 0570054

(51) Int. Cl.
*G06F 1/16* (2006.01)
*H01Q 1/22* (2006.01)
(Continued)

(52) U.S. Cl.
CPC .......... *G06F 1/1698* (2013.01); *G06F 1/1613* (2013.01); *G06F 1/1626* (2013.01);
(Continued)

(58) Field of Classification Search
CPC .... G06F 1/1613; G06F 1/1698; G06F 1/1626; H01Q 13/10; H01Q 1/2266; H01Q 1/243;
(Continued)

(56) References Cited

U.S. PATENT DOCUMENTS 6,137,072 A * 10/2000 Martter ................ H01H 13/702
200/5 A
2004/0201946 A1* 10/2004 Iwamatsu ............... H01T 23/00
361/230
(Continued)

FOREIGN PATENT DOCUMENTS

CN        101304640       11/2008
JP        19950055572 A    3/1995
(Continued)

*Primary Examiner* — Abhishek M Rathod
(74) *Attorney, Agent, or Firm* — ScienBiziP, P.C.

(57) ABSTRACT

A housing includes a metal base and a non-conductive member. The metal base has an internal surface and a plurality of gap. The non-conductive member covers at least a portion of the internal surface of the metal base, and the non-conductive member is formed on the bottom of the at least one gap. The metal base is spaced by the gaps to form a plurality of metal sheets and at least one main body. Each gap is completely filled with one dielectric member. The metal sheets and the at least one main body are all bonded with the dielectric member and are electrically isolated with each other.

18 Claims, 15 Drawing Sheets

(51) Int. Cl.
*H01Q 1/24* (2006.01)
*H01Q 1/40* (2006.01)
*H01Q 1/42* (2006.01)
*H01Q 13/10* (2006.01)
*H01Q 9/04* (2006.01)

(52) U.S. Cl.
CPC ............ *H01Q 1/2266* (2013.01); *H01Q 1/243* (2013.01); *H01Q 1/40* (2013.01); *H01Q 1/42* (2013.01); *H01Q 9/0485* (2013.01); *H01Q 13/10* (2013.01); *H05K 2201/09909* (2013.01)

(58) Field of Classification Search
CPC .......... H01Q 9/0485; H01Q 1/40; H01Q 1/42; H05K 2201/09909
See application file for complete search history.

(56) References Cited

U.S. PATENT DOCUMENTS

| | | | |
|---|---|---|---|
| 2008/0280083 A1* | 11/2008 | Qiu | C25D 3/12 428/35.8 |
| 2009/0139868 A1* | 6/2009 | Shrader | C25D 1/04 205/118 |
| 2009/0194308 A1* | 8/2009 | Cheng | B32B 15/01 174/50 |
| 2009/0258246 A1* | 10/2009 | Wu | C23C 18/1653 428/614 |
| 2011/0223382 A1* | 9/2011 | Gu | B29C 70/78 428/136 |
| 2014/0086441 A1* | 3/2014 | Zhu | H01Q 1/243 381/332 |
| 2014/0126172 A1* | 5/2014 | Fahlgren | H01Q 1/243 361/814 |
| 2014/0284096 A1* | 9/2014 | Wu | H05K 5/04 174/520 |
| 2015/0050968 A1* | 2/2015 | Jeon | C25D 5/48 455/575.1 |

FOREIGN PATENT DOCUMENTS

| | | |
|---|---|---|
| JP | 20060330127 A | 12/2006 |
| JP | 20090038722 A | 2/2009 |
| JP | 2011192956 A | 9/2011 |

\* cited by examiner

HOUSING AND ELECTRONIC DEVICE USING THE SAME

CROSS-REFERENCE TO RELATED APPLICATIONS

This application is a continuation application of U.S. patent application entitled "HOUSING, ELECTRONIC DEVICE USING THE SAME, AND METHOD FOR MAKING THE SAME" with application Ser. No. 14/607,500, filed on Jan. 28, 2015 and having the same assignee as the instant application.

This application claims priority to Chinese Patent Application No. 201410570054.1 filed on Oct. 23, 2014, and claims priority to U.S. patent application Ser. No. 14/607,500, filed on Jan. 28, 2015, the contents of which are incorporated by reference herein.

FIELD

The subject matter herein generally relates to a housing, an electronic device using the housing, and a method for making the housing.

BACKGROUND

Metal housings are widely used for electronic devices such as mobile phones or personal digital assistants (PDAs). Antennas are also important components in electronic devices. But the signal of the antenna located in the metal housing is often shield by the metal housing.

BRIEF DESCRIPTION OF THE FIGURES

Implementations of the present technology will now be described, by way of example only, with reference to the attached figures.

DETAILED DESCRIPTION

Figure 1:
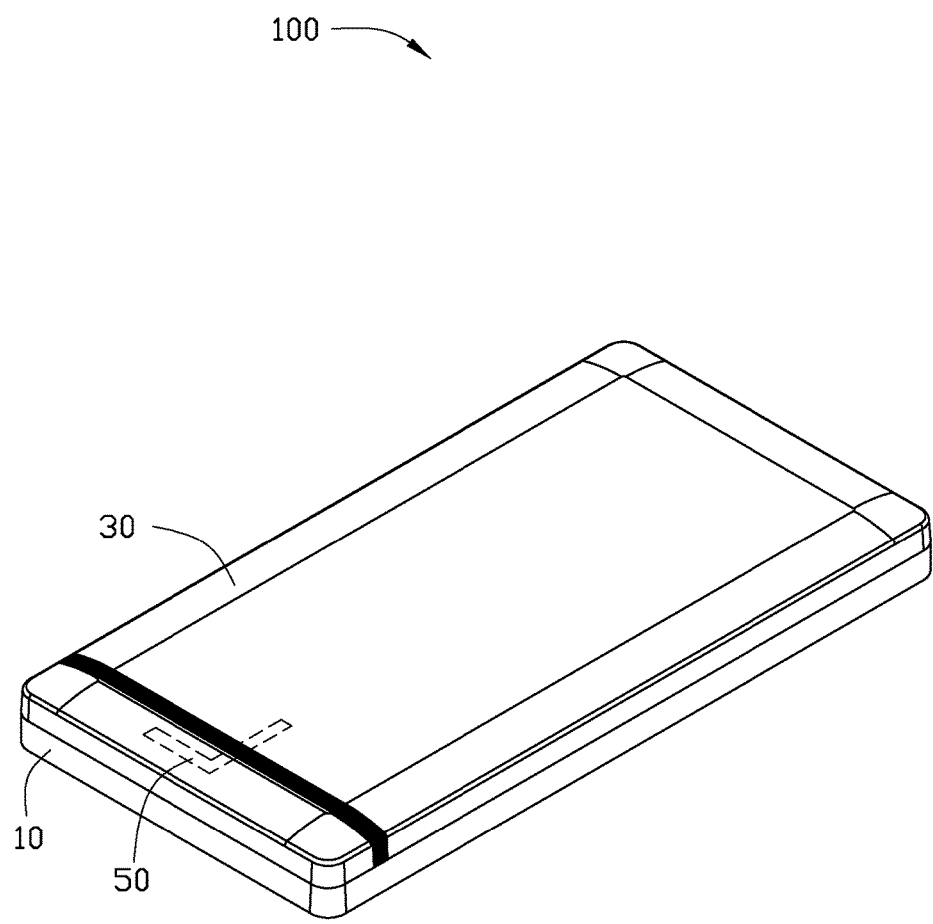
FIG. 1 is an isometric view of an electronic device, according to an exemplary embodiment.
Figure 2:
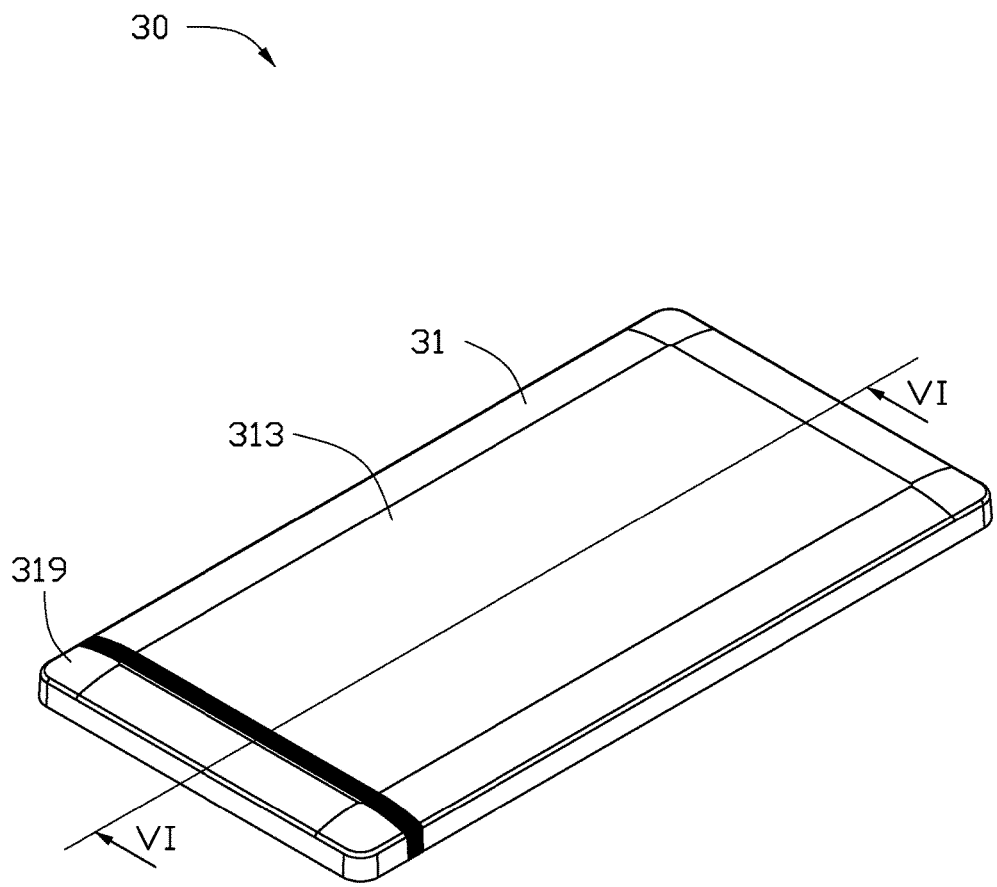
FIG. 2 is an isometric view of a housing of the electronic device shown in FIG. 1 according to a first exemplary embodiment.
Figure 3:
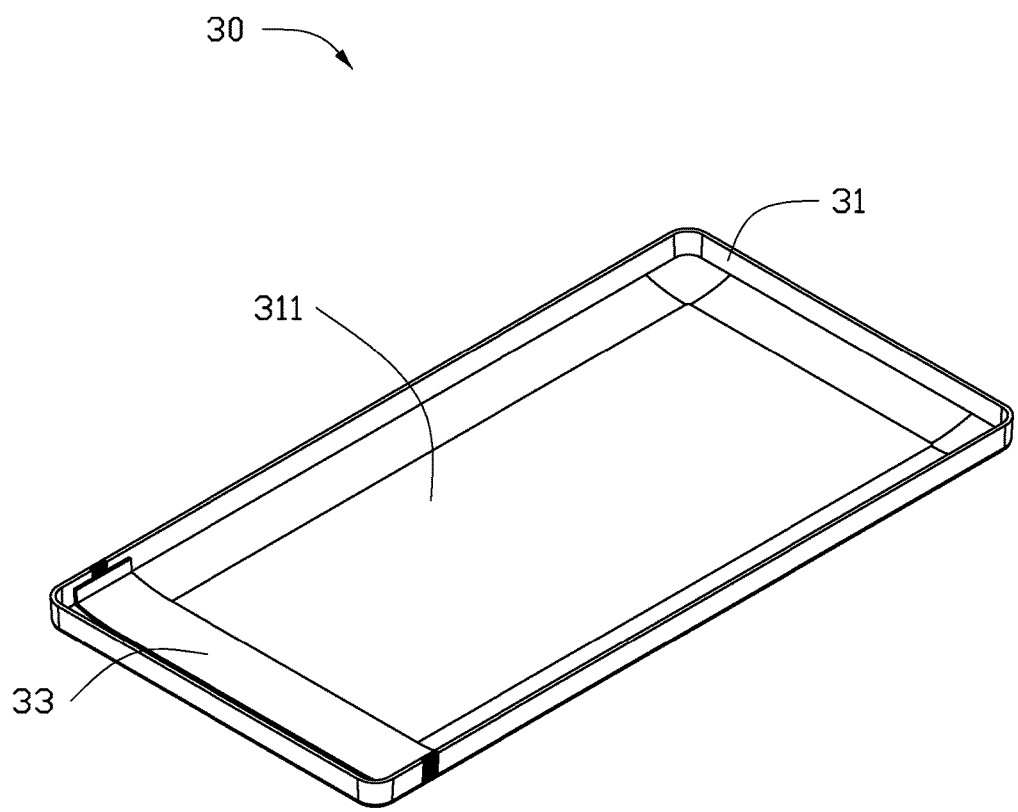
FIG. 3 is similar to FIG. 2, but shown from another angle.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series and the like. The term "coupled" when utilized, means "either a direct electrical connection between the things that are connected, or an indirect connection through one or more passive or active intermediary devices, but not necessarily limited to".

FIG. 1 illustrates an electronic device 100 according to an exemplary embodiment. The electronic device 100 can be, but not limited to, a mobile phone, a personal digital assistant or a tablet computer. The electronic device 100 includes a body 10, a housing 30 assembled to the body 10, and an antenna 50 located inside the housing 30.

The body 10 can have a printed circuit board (PCB, not shown) and a battery (not shown) electronically connected with the PCB. The battery can charge the electronic device 100.

Referring to FIGS. 2-5, in one exemplary embodiment, the housing 30 is a back cover of the electronic device 100. The housing 30 can include a metal base 31 and a non-conductive member 33, a dielectric member 35 received in the metal base 31, and a protective layer (not shown) formed on the metal base 31.

In at least one embodiment, the metal base 31 can be coupled with the antenna 50, such that the metal base 31 is used as a part of an antenna assembly of the electronic device 100. In alternative embodiments, the metal base 31 is not coupled with the antenna 50, such that the metal base 31 is not used as a part of the antenna assembly of the electronic device 100.

The metal base 31 includes an internal surface 311 and an outer surface 313 opposite to the internal surface 311. In at least one exemplary embodiment, a thickness of the metal base 31 is less than 0.5 mm, preferably, the thickness of the metal base is about 0.3 mm to about 0.5 mm. The non-conductive member 33 can directly cover at least a portion of the internal surface 311.

It is to be understood, the location, shape and dimension of the portion of the internal surface 311 covered with the non-conductive member 33 can be designed according to that of the housing 30.

The metal base 31 can be made of metal which can be selected from a group consisting of aluminium, aluminium alloy, magnesium, magnesium alloy, titanium, titanium alloy, copper and copper alloy.

Figure 6:
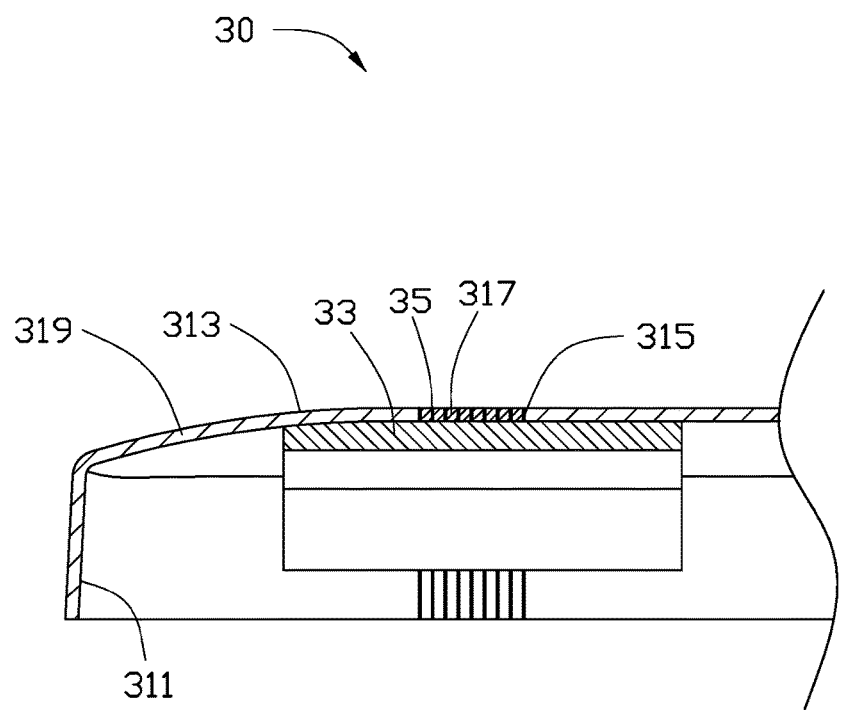
FIG. 6 is a cross-sectional view of the housing along line VI-VI of FIG. 2.

Referring to FIG. 6, sections of a portion of the metal base 31 are cut off to form at least one gap 315. The dielectric member 35 can be completely received in the gap 315. The non-conductive member 33 can be located at a bottom of the at least one gap 315. The antenna 50 corresponds to the at least one gap 315, the dielectric member 35 and the non-conductive member 33, such that signal of the antenna 50 can pass through the gap 315 to have a high radiation efficiency.

In at least one exemplary embodiment, the at least one gap 315 includes a plurality of gaps 315, and the metal base 31 is spaced by the gaps 315, forming a plurality of metal sheets 317 and at least one main body 319. The location of the metal sheets 317 and the at least one main body 319 does not move, because the metal sheets 317 and the at least one main body 319 are bonded with the non-conductive member 33, such that the housing 30 has high dimensional accuracy. Each metal sheet 317 has a width of about 0.15 mm to about 1.0 mm along a direction from an adjacent dielectric member 35 located at one side of the metal sheet 317 to another adjacent dielectric member 35 located at the opposite side of the metal sheet 317. Each gap 315 and each dielectric member 35 have a width of about 0.02 mm to about 0.7 mm along a direction from an adjacent dielectric member 35 located at one side of the metal sheet 317 to another adjacent dielectric member 35 located at the opposite side of the metal sheet 317.

Figure 4:
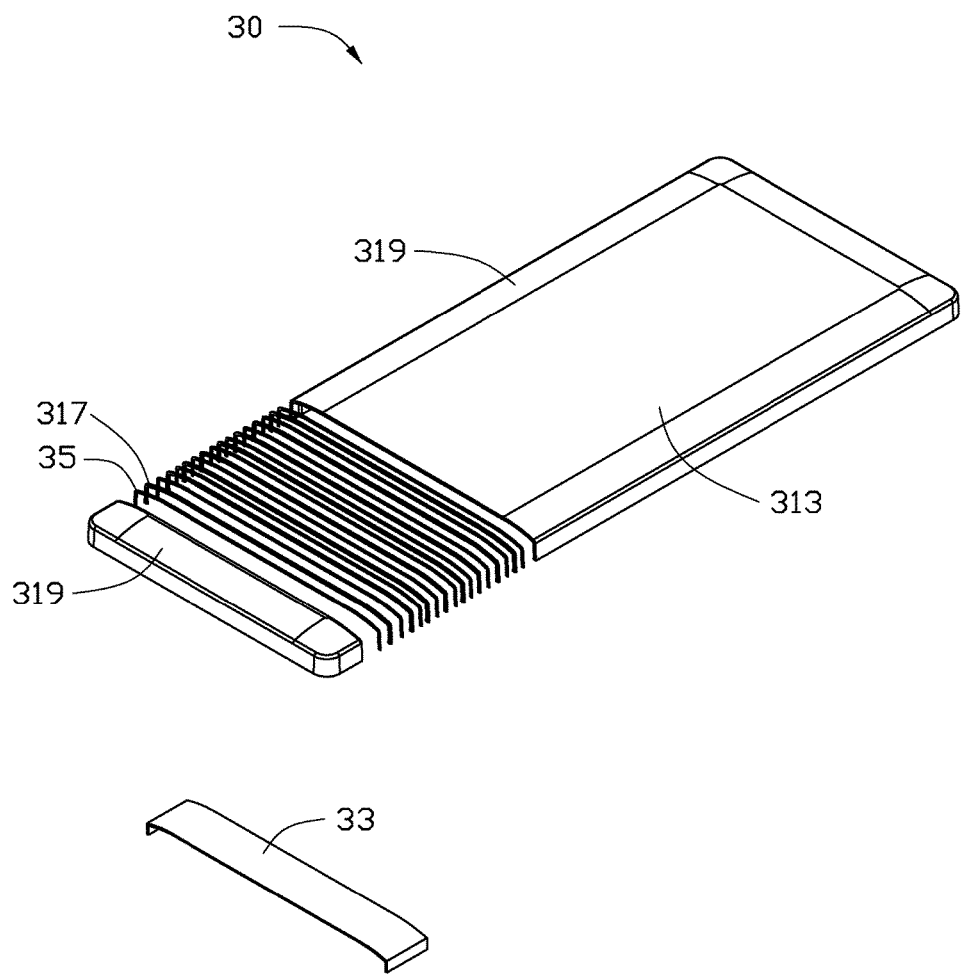
FIG. 4 is an exploded, isometric view of the housing shown in FIG. 2, according to the first exemplary embodiment.
Figure 5:
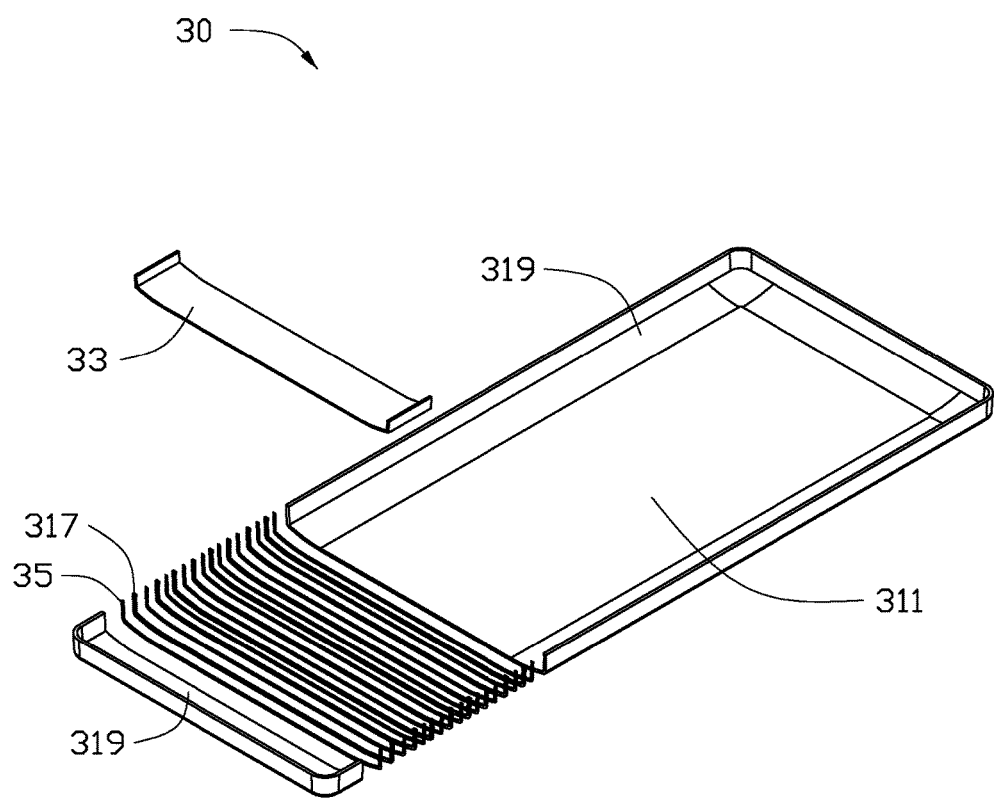
FIG. 5 is similar to FIG. 4, but shown from another angle.

Referring to FIGS. 4-6, in at least one exemplary embodiment, the metal base 31 is spaced by the gaps 315, forming a plurality of metal sheets 317 and two main bodies 319. Each gap 315 can run through the two opposite ends of the metal base 31 along a direction of the metal sheets 319 parallel to the main body 319.

The non-conductive member 33 can be made of a thermoplastic, a thermosetting plastic, a ceramic, or other non-conductive materials.

The thermoplastic can be selected from a group consisting of polybutylene terephthalate (PBT), polyphenylene sulfide (PPS), polyethylene terephthalate (PET), polyether ether ketone (PEEK), polycarbonate (PC) and polyvinyl chloride polymer (PVC). The thermosetting plastic can be selected from a group consisting of a polyurethane resin, an epoxy, and a polyurea resin.

The dielectric member 35 can be bonded with the non-conductive member 33, and completely received in the at least one gap 315 to bond the metal sheets 317 with the at least one main body 319. That is, the dielectric member 35 is completely filled within each gap 315. The main body 319 is disconnected from the metal sheet 317 adjacent to the main portion 310. In addition, each two adjacent metal sheets 317 are electrically isolated to each other by one dielectric member 35 located between the two metal sheets 317. The signal of the antenna 50 can pass through the dielectric member 35, such that the antenna 50 has a high radiation efficiency.

The dielectric member 35 can be made of dielectric material, such as resin, rubber, ceramic, and so on.

The resin can be made of a thermoplastic or a thermosetting plastic. The thermoplastic can be selected from a group consisting of polybutylene terephthalate (PBT), polyphenylene sulfide (PPS), polyethylene terephthalate (PET), polyether ether ketone (PEEK), polycarbonate (PC) and polyvinyl chloride polymer (PVC). The thermosetting plastic can be selected from a group consisting of an epoxy, and a polyurea resin, and a UV-curing adhesive. The UV-curing adhesive can be acrylic resin or polyurethane.

The protective layer (not shown) can be formed by an anodic oxidation coloring process, a spraying process or an electrophoresis process. The protective layer can have a thickness of about 10 μm to about 15 μm and cover the internal surface 311 and the outer surface 311 of the metal base 31.

Figure 7:
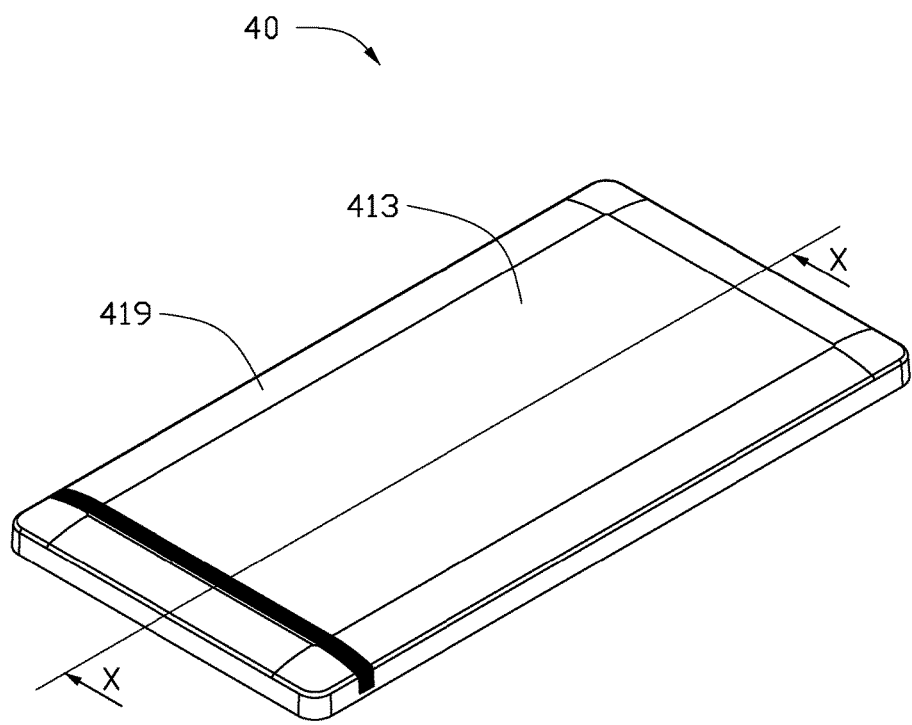
FIG. 7 is an isometric view of a housing according to a second exemplary embodiment.
Figure 8:
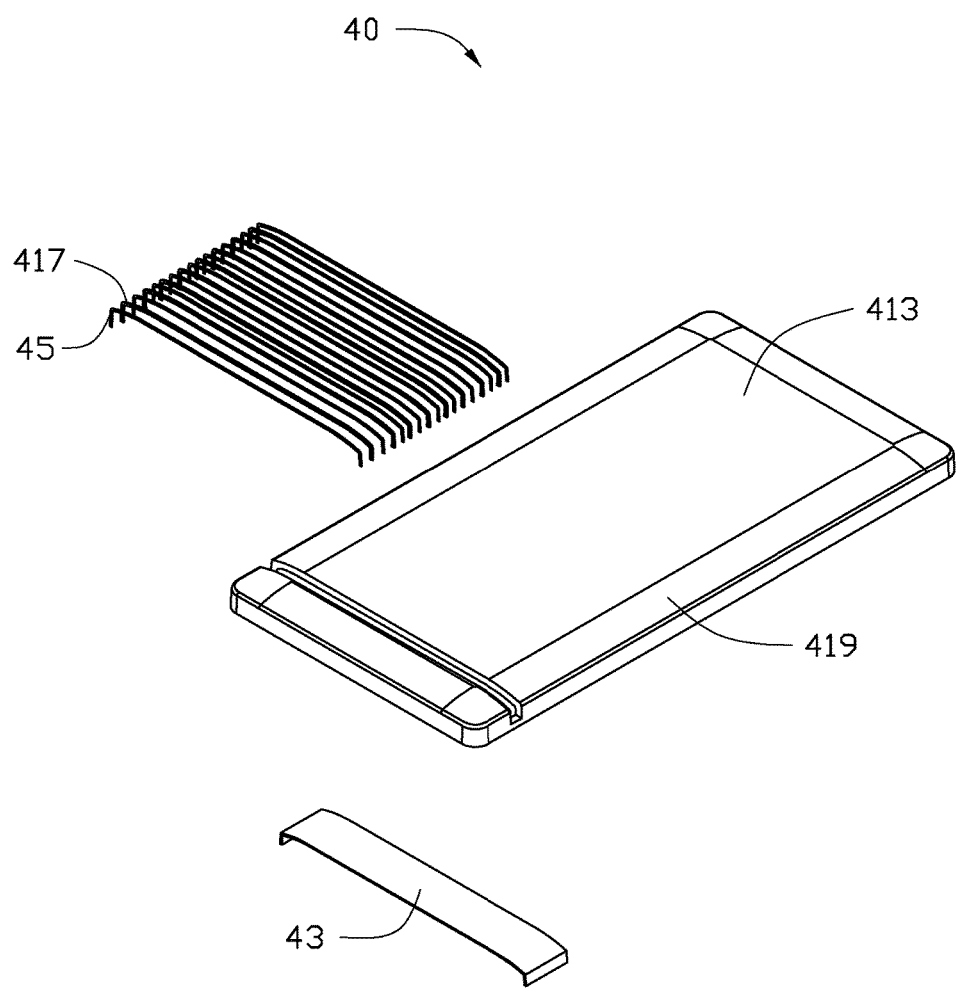
FIG. 8 is an exploded, isometric view of the housing shown in FIG. 7.
Figure 9:
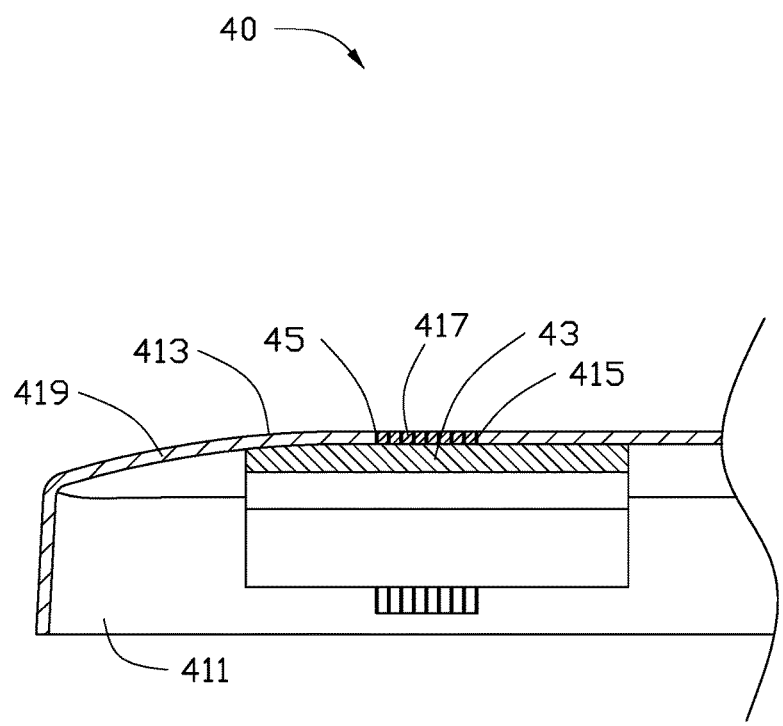
FIG. 9 is a cross-sectional view of the housing along line X-X of FIG. 7.

FIGS. 7-9 illustrate a housing 40 according to a second exemplary embodiment. The difference between the housing 40 of the second exemplary embodiment and the housing 30 of the first exemplary embodiment is that the metal base 41 is spaced by the gaps 415, forming a plurality of metal sheets 417 and one main body 419. The gaps 415 are positioned within the metal base 41. And the gaps 415 cannot run through at least one end of the metal base 41 along a direction of the metal sheets 419 parallel to the main body 419.

Figure 10:
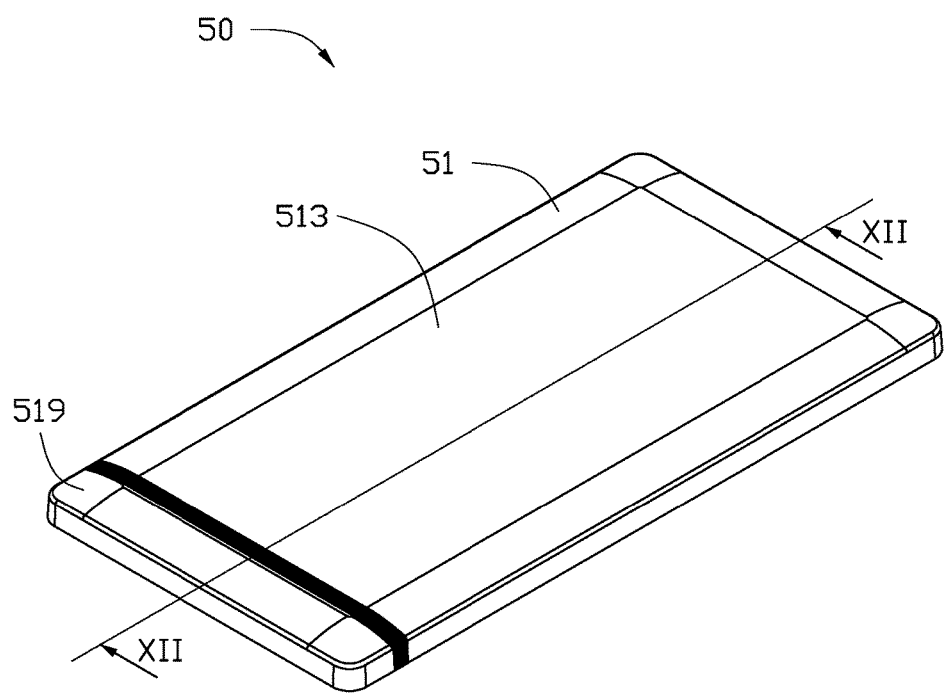
FIG. 10 is an isometric view of a housing according to a third exemplary embodiment.
Figure 11:
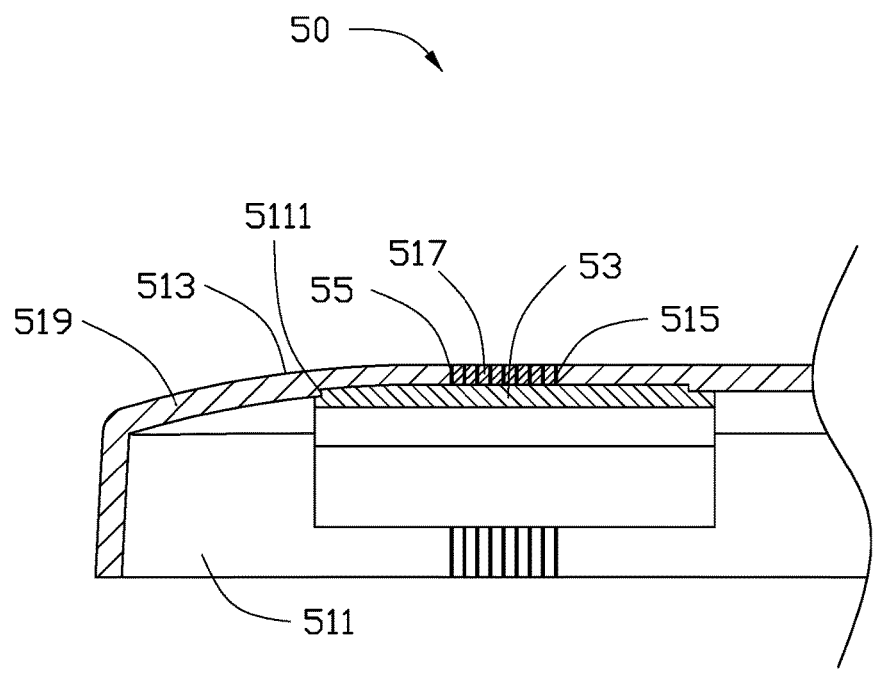
FIG. 11 is a cross-sectional view of the housing along line XII-XII of FIG. 10.

FIGS. 10-11 illustrate a housing 50 according to a third exemplary embodiment. The difference between the housing 50 of the third exemplary embodiment and the housing 30 of the first exemplary embodiment is that a thickness of the metal base 51 is more than 0.5 mm. Preferably, the thickness of the metal base 51 is about 0.8 mm to about 1.0 mm. Sections of a portion of an internal surface 511 of the metal base 51 can be thinned to form a groove 5111 by a thinning process. A non-conductive member 53 can be received in the groove 5111. The thickness of the metal base 51 corresponding to the groove 5111 can be about 0.3 mm to about 0.5 mm. The thinning process can be carried out by a computer number control technology (CNC). It is to be understood that the non-conductive member 53 can also cover a periphery of groove 5111 to enhance the bonding strength between the non-conductive member 53 and the metal base 51.

Figure 12:
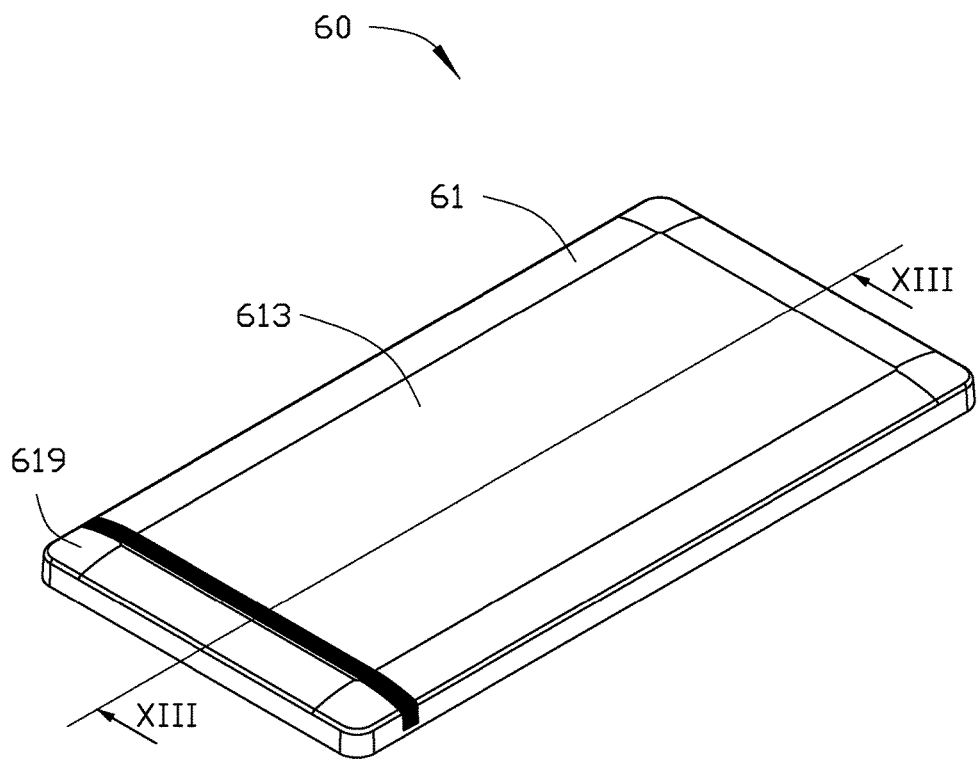
FIG. 12 is an isometric view of a housing according to a fourth exemplary embodiment.
Figure 13:
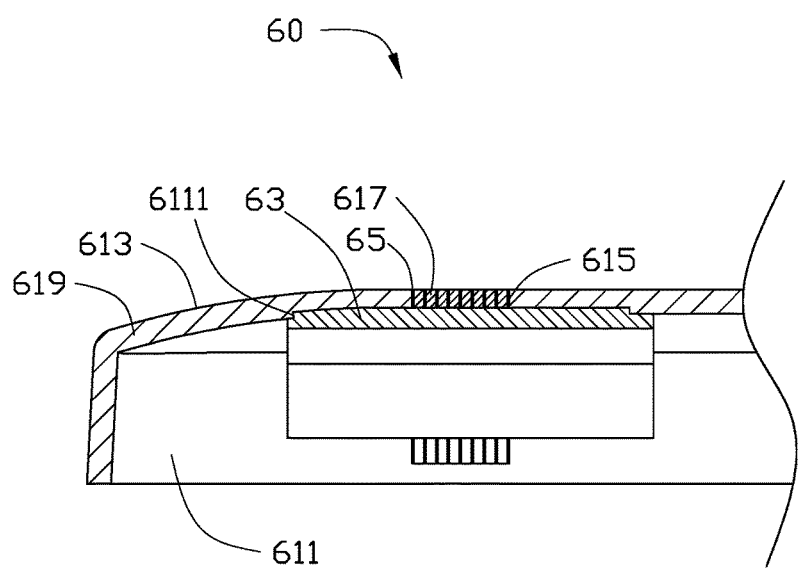
FIG. 13 is a cross-sectional view of the housing along line XIII-XIII of FIG. 12.

FIGS. 12-13 illustrate a housing 60 according to a fourth exemplary embodiment. The difference between the housing 60 of the fourth exemplary embodiment and the housing 40 of the second exemplary embodiment is that a thickness of the metal base 61 is more than 0.5 mm. Preferably, the thickness of the metal base 61 is about 0.8 mm to about 1.0 mm. Sections of a portion of an internal surface 611 can be thinned to form a groove 6111 by a thinning process. Non-conductive member 63 can be received in the groove 6111. A thickness of the metal base 61 corresponding to the groove 6111 can be about 0.3 mm to about 0.5 mm. The thinning process can be carried out by a CNC technology. It is to be understood that the non-conductive member 63 can also cover a periphery of groove 6111 to enhance the bonding strength between the non-conductive member 63 and the metal base 61.

Figure 14:
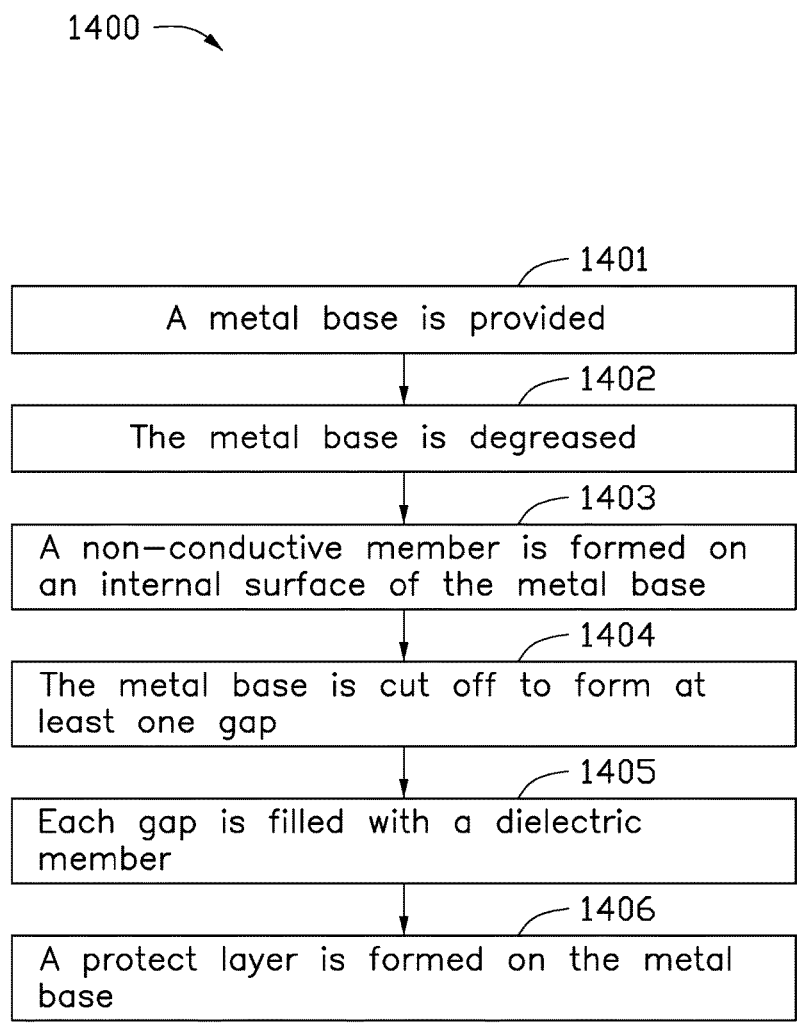
FIG. 14 is a flow chart of a method for making a housing in accordance with a first exemplary embodiment.

Referring to FIG. 14, a flowchart is presented in accordance with an example embodiment. The method 1400 is provided by way of example, as there are a variety of ways to carry out the method. The method 1400 described below can be carried out using the configurations illustrated in FIGS. 1-6, for example, and various elements of these figures are referenced in explaining method 1400. Each block shown in FIG. 14 represents one or more processes, methods or subroutines, carried out in the method 1400. Furthermore, the order of blocks is illustrative only and the order of the blocks can change according to the present disclosure. Additional blocks may be added or fewer blocks may be utilized, without departing from this disclosure. The method 1400 for making the housing 30 can begin at block 1401.

At block 1401, a metal base 31 is provided. The metal base 31 has an internal surface 311 and an outer surface 313 opposite to the internal surface 311. In at least one exemplary embodiment, a thickness of the metal base is less than 0.5 mm. Preferably, the thickness of the metal base is about 0.3 mm to about 0.5 mm.

The metal base 31 can be made by casting, punching, or CNC. The metal base 31 having a desired three dimensional shape is provided. The metal base 31 can be made of metal which can be selected from a group consisting of aluminium, aluminium alloy, magnesium, magnesium alloy, titanium, titanium alloy, copper and copper alloy.

At block 1402, the metal base 31 is degreased. The degreasing process may include ultrasonic cleaning the metal base 31 in absolute ethanol for about 25 minutes to about 35 minutes to remove oil stain coated on the metal base 31.

At block 1403, the metal base 31 is put into a mold (not shown) to form a non-conductive member 33 on an internal surface of the metal base 31. The injection temperature is about 290° C. to about 320° C., and the injection pressure is about 2 MPa to about 4 MPa. Liquid resin can be filled into the mold and cover at least a portion of the internal surface 311 of the metal base 31, forming the non-conductive member 31.

It is to be understood that the non-conductive member 33 can be formed by a conventional injection process, and also can be formed by a nano mold technology (NMT).

NMT can be carried out by surface treating the metal base 31 to form a plurality of nano-pores (not shown) having a diameter of about 10 nm to about 300 nm on the internal surface 311, such that the internal surface 311 can have a surface roughness of about 0.1 µm to about 1 µm. The surface treatment can be an electrochemical etching process, a dipping process, an anodic oxidation treatment or a chemical etching process. Then, the metal base 31 having nano-pores is put into a mold (not shown), and liquid resin is filled into the mold and cover at least a portion of the internal surface 311 of the metal base 31, forming the non-conductive member 33.

The resin for making the non-conductive member 33 can be a thermoplastic or a thermosetting plastic. The thermoplastic can be selected from a group consisting of polybutylene terephthalate (PBT), polyphenylene sulfide (PPS), polyethylene terephthalate (PET), polyether ether ketone (PEEK), polycarbonate (PC) and polyvinyl chloride polymer (PVC). The thermosetting plastic can be selected from a group consisting of a polyurethane resin, an epoxy, and a polyurea resin.

It is to be understood that the non-conductive member 33 can also be made of ceramic, or other non-conductive materials At block 1404, sections of a portion of the metal base 31 corresponding to the non-conductive member 33 are cut off from the outer surface 313 to form at least one gap 315, and the metal base 31 can be spaced by at least one gap 315, forming at least one metal sheet 317 and at least one main body 319. The non-conductive member 33 is located at the bottom of the gap 315. The metal base 31 can be cut off by a laser cutting process or a CNC process.

In at least one exemplary embodiment, the metal base 31 is spaced by the at least one gap 315, forming a plurality of metal sheets 317 and two main bodies 319. The gaps 315 can run through the two opposite ends of the metal base 31.

At block 1405, each gap 315 is completely filled with a dielectric member 35. Then, the main body 319 is disconnected from the metal sheet 317 adjacent to the main portion 310. In addition, each two adjacent metal sheets 317 are electrically isolated to each other by one dielectric member 35 located between the two metal sheets 317. The dielectric member 35 can be made of a dielectric material, such as a resin, a rubber, a ceramic, and so on. The resin can be made of a thermoplastic or a thermosetting plastic. The thermoplastic can be selected from a group consisting of polybutylene terephthalate (PBT), polyphenylene sulfide (PPS), polyethylene terephthalate (PET), polyether ether ketone (PEEK), polycarbonate (PC) and polyvinyl chloride polymer (PVC). The thermosetting plastic can be selected from a group consisting of an epoxy, and a polyurea resin, and a UV-curing adhesive.

The dielectric member 35 can be formed by any of the following three methods:

In a first method, after filling a UV-curing adhesive into the gaps 315, the UV-curing adhesive is cured by a UV irradiation process to form the dielectric members 35 located in the gaps 315. The UV-curing adhesive can be an acrylic resin or a polyurethane resin.

In a second method, the metal base 31 is put into a mold (not shown). The injection temperature can be about 290° C. to about 320° C., and the injection pressure can be about 2 MPa to about 4 MPa. Liquid resin can be completely filled into the gaps 315, forming the dielectric members 35.

In a third method, the dielectric members 35 are formed by NMT.

The NMT is carried out by surface treating the metal base 31, the metal sheets 317 and the main bodies 319 to form a plurality of nano-pores (not shown) having a diameter of about 10 nm to about 300 nm on the metal base 31, metal sheets 317 and the main bodies 319. The surface treating method can be an electrochemical etching process, a dipping process, an anodic oxidation treatment or a chemical etching process. Then, the metal base 31, the metal sheets 317 and the main bodies 319 having nano-pores are put into a mold (not shown), and liquid resin is completely filled into the gaps 315 between each two adjacent metal sheets 317, the main bodies 319 and the metal sheets 317 adjacent the main bodies 319, forming the dielectric member 35

The gaps 315 and the dielectric member 35 both have a width of about 0.02 mm to about 0.7 mm along a direction from an adjacent dielectric member 35 located at one side of the metal sheet 317 to another adjacent dielectric member 35 located at the opposite side of the metal sheet 317. Each metal sheet 317 has a width of about 0.15 mm to about 1.0 mm along a direction from an adjacent dielectric member 35 located at one side of the metal sheet 317 to another adjacent dielectric member 35 located at the opposite side of the metal sheet 317.

At block 1406, a protective layer (not shown) having a thickness of about 10 µm to about 15 µm is formed on the surface of the metal base 31. The protective layer can be formed by any of the following three methods:

In a first method, the protective layer is formed by an anodic oxidation coloring process. The anodic oxidation coloring process is carried out in a sulphuric acid solution having a concentration of about 160 g/L to about 220 g/L, with the metal base 31 being an anode, and a stainless steel board or a lead plate being a cathode. The voltage between the anode and the cathode is about 10 V to about 15 V. The temperature of the sulphuric acid is about 16° C. to about 18° C. The anodic oxidation coloring process may last for about 30 minutes to about 45 minutes to form the protective layer having a thickness of about 10 µm to about 15 µm. The protective layer has a plurality of pores (not shown). Then, the metal base 31 is dipped into a dyeing solution containing coloring agent at a temperature of about 30° C. to about 50° C. The coloring agent has a concentration of about 3 g/L to about 10 g/L. The dipping time may be about 1 minute to about 2 minutes. The coloring agent is absorbed into the pores of the protective layer, such that the protective layer can have color. The coloring agent is a dark organic coloring agent or a dark inorganic coloring agent. The protective layer containing coloring agent should be sealed to fix the coloring agent in the pores. The sealing treatment can be a boiling water sealing process, a steam sealing process, a nickel acetate sealing process, a potassium dichromate sealing process, a nickel sulfate sealing process, stearic acid sealing process, or a cold sealing process.

In a second method, the protective layer is formed by an electrophoresis process. The electrophoresis process is carried out in an electrophoresis solution at a temperature of about 30° C. to about 35° C., with the metal base 31 being an anode, and a stainless steel board or a lead plate being a cathode. The voltage between the anode and the cathode is about 70 V to about 90 V. The electrophoresis process may last for about 20 seconds to about 44 seconds to form the protective layer having a thickness of about 10 μm to about 15 μm. The electrophoresis solution includes electrophoresis paint and water with a volume ratio of about 3-5:4-6. The electrophoresis paint can be an epoxy electrophoresis paint. The main chain of the epoxy electrophoresis paint can have polyether and dual alcohol, polyether and dual amine, or polyester and dual alcohol.

It is to be understood that the protective layer formed by the electrophoresis process or the anodic oxidation coloring process can cover an area of the metal base 31. As the width of the dielectric member 35 is very small, it is hard to find out the dielectric member 35 located in the metal base 31, such that the housing 30 can have an entire metallic appearance.

In a third method, the protective layer is formed by spraying paint onto the surface of the metal base 31 by a spraying gun (not shown). Then, the metal base 31 is put in a dryer to be backed, such that the protective layer having a thickness of about 10 μm to about 15 μm is formed on the entail surface of the metal base 31. As the paint can cover the entire surface of the metal base 31 and the dielectric member 35, the metal base 31 can have an entire metallic appearance.

FIGS. 7-9 illustrate a housing 40 according to a second exemplary embodiment. The difference between the method of the second exemplary embodiment and the method of the first exemplary embodiment is that the metal base 41 is spaced by gaps 415, forming a plurality of metal sheets 417 and one main body 419. The gaps 415 can be positioned within the metal base 41. And the gaps 415 cannot run through at least one end of the metal base 41 along a direction of the metal sheets 419 parallel to the main body 419.

Figure 15:
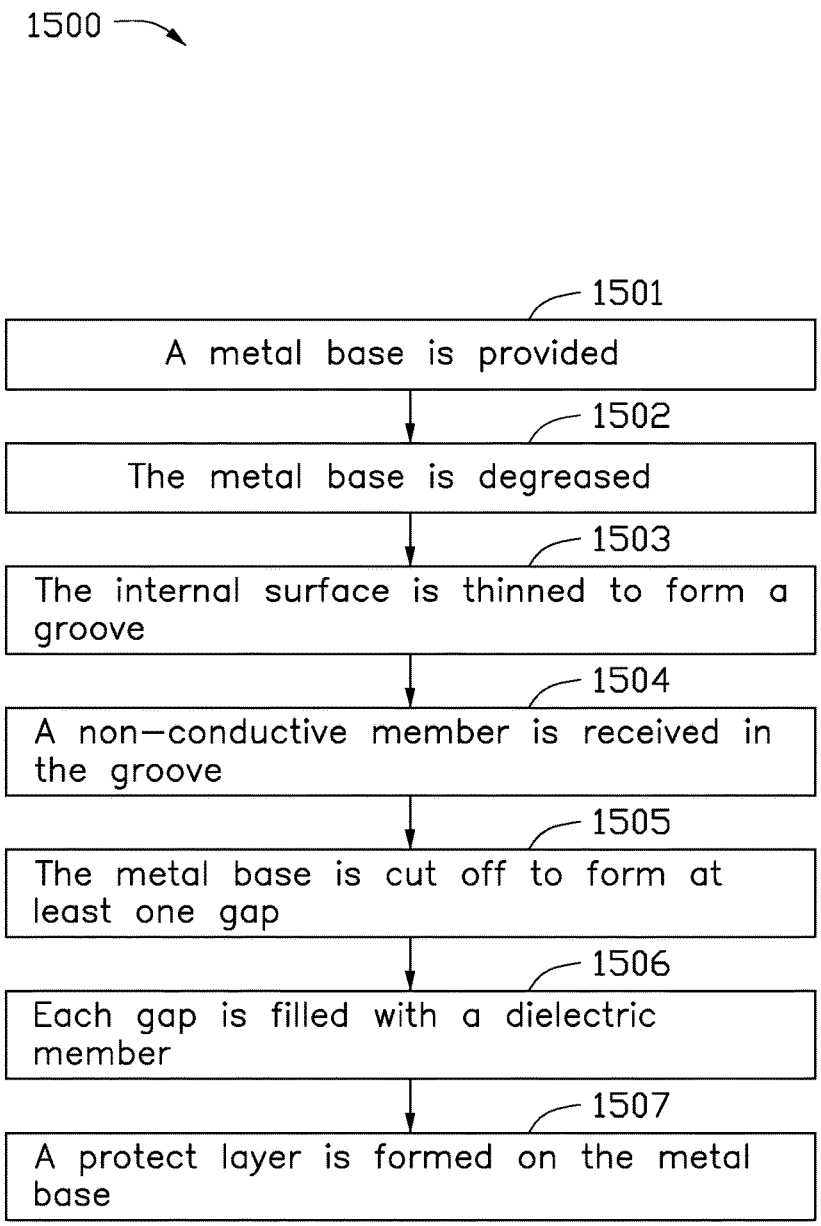
FIG. 15 is another flow chart of a method for making a housing in accordance with a second exemplary embodiment.

Referring to FIG. 15, a flowchart is presented according to another exemplary embodiment. The method 1500 is provided by way of example, as there are a variety of ways to carry out the method. The method 1500 described below can be carried out using the configurations illustrated in FIGS. 10-11, for example, and various elements of these figures are referenced in explaining method 1500. Each block shown in FIG. 15 represents one or more processes, methods or subroutines, carried out in the method 1500. Furthermore, the order of blocks is illustrative only and the order of the blocks can change according to the present disclosure. Additional blocks may be added or fewer blocks may be utilized, without departing from this disclosure. The method 1500 for making the housing 50 can begin at block 1501.

At block 1501, a metal base 51 is provided. The metal base 51 has an internal surface 511 and an outer surface 513 opposite to the internal surface 511. In at least one exemplary embodiment, a thickness of the metal base 51 is less than 0.5 mm. Preferably, the thickness of the metal base 51 is about 0.3 mm to about 0.5 mm. A thickness of the metal base 51 is more than 0.5 mm. Preferably, the thickness of the metal base 51 is about 0.8 mm to about 1.0 mm.

The metal base 51 can be made by casting, punching, or CNC. The metal base 51 having a desired three dimensional shape is provided. The metal base 51 can be made of a metal which can be selected from a group consisting of aluminium, aluminium alloy, magnesium, magnesium alloy, titanium, titanium alloy, copper and copper alloy.

At block 1502, the metal base 51 is degreased. The degreasing process may include ultrasonic cleaning the metal base 51 in absolute ethanol for about 25 minutes to about 35 minutes to remove oil stain coated on the metal base 51.

At block 1503, a groove 5111 is formed on the metal base 51 by a thinning process. The thickness of the metal base 51 corresponding to the groove 5111 can be about 0.3 mm to about 0.5 mm. The thinning process can be carried out by a CNC technology.

At block 1504, the metal base 51 is put into a mold (not shown) to form a non-conductive member 53 on an internal surface of the metal base 51, the non-conductive member 53 can be received in the groove 5111. The injection temperature is about 290° C. to about 320° C., and the injection pressure is about 2 MPa to about 4 MPa. Liquid resin can be filled into the mold and cover at least a portion of the internal surface 511 of the metal base 51, forming the non-conductive member 51.

It is to be understood, the non-conductive member 53 can also cover a periphery of groove 5111 to enhance the bonding strength between the non-conductive member 53 and the metal base 51.

It is to be understood that the non-conductive member 53 can be formed by a conventional injection process, and also can be formed by a nano mold technology (NMT) as illustrated in block 1403.

At block 1505, sections of a portion of the metal base 51 corresponding to the non-conductive member 53 are cut off from the outer surface 513 to form at least one gap 515, and the metal base 51 can be spaced by at least one gap 515, forming at least one metal sheet 517 and at least one main body 519. The non-conductive member 53 is located at the bottom of the gap 515. The metal base 51 can be cut off by a laser cutting process or a CNC process.

In at least one exemplary embodiment, the metal base 51 is spaced by the at least one gap 515, forming a plurality of metal sheets 517 and two main bodies 519. The gaps 515 can run through the two opposite ends of the metal base 51.

At block 1506, each gap 515 is completely filled with a dielectric member 55. Then, the main body 319 is disconnected from the metal sheet 317 adjacent to the main portion 310. In addition, each two adjacent metal sheets 317 are electrically isolated to each other by one dielectric member 35 located between the two metal sheets 317. The dielectric member 55 can be made of a dielectric material, such as a resin, a rubber, a ceramic, and so on. The resin can be made of a thermoplastic or a thermosetting plastic. The thermoplastic can be selected from a group consisting of polybutylene terephthalate (PBT), polyphenylene sulfide (PPS), polyethylene terephthalate (PET), polyether ether ketone (PEEK), polycarbonate (PC) and polyvinyl chloride polymer (PVC). The thermosetting plastic can be selected from a group consisting of an epoxy, and a polyurea resin, and a UV-curing adhesive.

The dielectric member 55 can be formed by any of the following three methods:

In a first method, after filling a UV-curing adhesive into the gaps 515, the UV-curing adhesive is cured by a UV irradiation process to form the dielectric members 55 located in the gaps 515. The UV-curing adhesive can be an acrylic resin or a polyurethane resin.

In a second method, the metal base 51 is put into a mold (not shown). The injection temperature can be about 290° C. to about 320° C., and the injection pressure can be about 2 MPa to about 4 MPa. Liquid resin can be completely filled into the gaps 515, forming the dielectric members 55.

In a third method, the dielectric members 55 are formed by NMT.

The NMT is carried out by surface treating the metal base 51, the metal sheets 517 and the main bodies 519 to form a plurality of nano-pores (not shown) having a diameter of about 10 nm to about 300 nm on the metal base 51, metal sheets 517 and the main bodies 519. The surface treating method can be an electrochemical etching process, a dipping process, an anodic oxidation treatment or a chemical etching process. Then, the metal base 51, the metal sheets 517 and the main bodies 519 having nano-pores are put into a mold (not shown), and liquid resin is completely filled into the gaps 515 between each two adjacent metal sheets 517, the main bodies 519 and the metal sheets 517 adjacent the main bodies 519, forming the dielectric member 55.

The gaps 515 and the dielectric member 55 both have a width of about 0.02 mm to about 0.7 mm along a direction from an adjacent dielectric member 55 located at one side of the metal sheet 517 to another adjacent dielectric member 55 located at the opposite side of the metal sheet 517. Each metal sheet 517 has a width of about 0.15 mm to about 1.0 mm along a direction from an adjacent dielectric member 55 located at one side of the metal sheet 517 to another adjacent dielectric member 55 located at the opposite side of the metal sheet 517.

At block 1507, a protective layer (not shown) having a thickness of about 10 μm to about 15 μm is formed on the surface of the metal base 51. The protective layer can be formed by any of the following three methods:

In a first method, the protective layer is formed by an anodic oxidation coloring process. The anodic oxidation coloring process is carried out in a sulphuric acid solution having a concentration of about 160 g/L to about 220 g/L, with the metal base 51 being an anode, and a stainless steel board or a lead plate being a cathode. The voltage between the anode and the cathode is about 10 V to about 15 V. The temperature of the sulphuric acid is about 16° C. to about 18° C. The anodic oxidation coloring process may last for about 30 minutes to about 45 minutes to form the protective layer having a thickness of about 10 μm to about 15 μm. The protective layer has a plurality of pores (not shown). Then, the metal base 51 is dipped into a dyeing solution containing coloring agent at a temperature of about 30° C. to about 50° C. The coloring agent has a concentration of about 3 g/L to about 10 g/L. The dipping time may be about 1 minute to about 2 minutes. The coloring agent is absorbed into the pores of the protective layer, such that the protective layer can have color. The coloring agent is a dark organic coloring agent or a dark inorganic coloring agent. The protective layer containing coloring agent should be sealed to fix the coloring agent in the pores. The sealing treatment can be a boiling water sealing process, a steam sealing process, a nickel acetate sealing process, a potassium dichromate sealing process, a nickel sulfate sealing process, stearic acid sealing process, or a cold sealing process.

In a second method, the protective layer is formed by an electrophoresis process. The electrophoresis process is carried out in an electrophoresis solution at a temperature of about 30° C. to about 35° C., with the metal base 51 being an anode, and a stainless steel board or a lead plate being a cathode. The voltage between the anode and the cathode is about 70 V to about 90 V. The electrophoresis process may last for about 20 seconds to about 44 seconds to form the protective layer having a thickness of about 10 μm to about 15 μm. The electrophoresis solution includes electrophoresis paint and water with a volume ratio of about 3-5:4-6. The electrophoresis paint can be an epoxy electrophoresis paint. The main chain of the epoxy electrophoresis paint can have polyether and dual alcohol, polyether and dual amine, or polyester and dual alcohol.

It is to be understood that the protective layer formed by the electrophoresis process or the anodic oxidation coloring process can cover an area of the metal base 51. As the width of the dielectric member 55 is very small, it is hard to find out the dielectric member 55 located in the metal base 51, such that the housing 50 can have an entire metallic appearance.

In a third method, the protective layer is formed by spraying paint onto the surface of the metal base 51 by a spraying gun (not shown). Then, the metal base 51 is put in a dryer to be backed, such that the protective layer having a thickness of about 10 μm to about 15 μm is formed on the entail surface of the metal base 51. As the paint can cover the entire surface of the metal base 51 and the dielectric member 55, the metal base 51 can have an entire metallic appearance.

FIGS. 12-13 illustrate a housing 60 according to a fourth exemplary embodiment. The difference between the method of the fourth exemplary embodiment and the method of the second exemplary embodiment can be that a thickness of the metal base 61 is more than 0.5 mm. Preferably, the thickness of the metal base 31 is about 0.8 mm to about 1.0 mm, and sections of a portion of an internal surface 611 can be thinned to form a groove 6111 by a thinning process. A non-conductive member 63 can be received in the groove 3111. The thickness of the metal base 61 corresponding to the groove 6111 is about 0.3 mm to about 0.5 mm. The thinning process can be carried out by a CNC technology. It is to be understood, the non-conductive member 63 can also cover a periphery of groove 6111 to enhance the bonding strength between the non-conductive member 63 and the metal base 61.

It is to be understood, however, that even through numerous characteristics and advantages of the present disclosure have been set forth in the foregoing description, together with details of assembly and function, the disclosure is illustrative only, and changes may be made in detail, including in the matters of shape, size, and arrangement of parts within the principles of the disclosure to the full extent indicated by the broad general meaning of the terms in which the appended claims are expressed.

What is claimed is:
1. A housing comprising:
  a metal base defining an internal surface and a plurality of gaps; and
  a non-conductive member covering at least a portion of the internal surface of the metal base, and the non-conductive member being formed on a bottom of the at least one gap;

wherein the metal base is spaced by the gaps to form a plurality of metal sheets and at least one main body, each of the metal sheets is substantially U-shaped, each of the gaps is completely filled with a dielectric member, each of the dielectric member is substantially U-shaped, the metal sheets and the at least one main body are bonded with the dielectric member and are electrically isolated from with each other;

wherein the internal surface of the metal base is thinned to form a groove, a location of the groove corresponds to the plurality of the gaps, the nonconductive member is received in the groove.

2. The housing of claim 1, wherein each of the gaps has a width of 0.02 mm to 0.7 mm along a direction from an adjacent one of the dielectric member located at one side of a corresponding one of the plurality of metal sheets to another adjacent one of the dielectric member located at an opposite side of the corresponding metal sheet;

each of the dielectric member has a width of 0.02 mm to 0.7 mm along a direction from an adjacent dielectric member located at one side of a corresponding one of the metal sheet to another adjacent one of the dielectric member located at an opposite side of the corresponding metal sheet.

3. The housing of claim 1, wherein each of the metal sheet has a width of 0.15 mm to 1.0 mm along a direction from an adjacent one of the dielectric member located at one side of a corresponding one of the metal sheet to another adjacent one of the dielectric member located at an opposite side of the corresponding one of the metal sheet.

4. The housing of claim 1, wherein the dielectric member is made of resin, rubber, or ceramic.

5. The housing of claim 1, wherein the metal base is made of material selected from a group consisting of aluminum, aluminum alloy, magnesium, magnesium alloy, titanium, titanium alloy, copper and copper alloy.

6. The housing of claim 1, wherein the non-conductive member is selected from a group consisting of polybutylene terephthalate, polyphenylene sulfide, polyethylene terephthalate, polyether ether ketone, polycarbonate, polyvinyl chloride polymer, polyurethane resin, epoxy, and polyurea resin.

7. The housing of claim 1, wherein a length of each of the plurality of metal sheets is equal to a width of the housing.

8. The housing of claim 1, wherein the non-conductive member is a U-shaped sheet.

9. The housing of claim 8, wherein a width of the non-conductive member is larger than a total width of the plurality of metal sheets and the plurality of dielectric members.

10. An electronic device, comprising:
a body;
a housing assembled on the body, the housing comprising a metal base and a non-conductive member, the metal base defining an internal surface and a plurality of gaps, the non-conductive member covering at least a portion of the internal surface of the metal base, and the non-conductive member being formed on a bottom of the at least one gap; and
an antenna located inside the housing, the antenna corresponding to the at least one gap;
wherein the metal base is spaced by the gaps to form a plurality of metal sheets and at least one main body, each of the metal sheet is substantially U-shaped, each of the gaps is completely filled with a dielectric member, each of the dielectric member is substantially U-shaped, the metal sheets and the at least one main body are bonded with the dielectric member and are electrically isolated from each other;
wherein the internal surface of the metal base is thinned to form a groove, a location of the groove corresponds to the plurality of gaps, the non-conductive member is received in the groove.

11. The electronic device of claim 10, wherein the metal base is a part of the antenna and couples with the antenna.

12. The housing of claim 1, wherein each of the gaps has a width of 0.02 mm to 0.7 mm along a direction from an adjacent one of the dielectric member located at one side of a corresponding one of the plurality of metal sheets to another adjacent one of the dielectric member located at an opposite side of the corresponding metal sheet; and each of the metal sheet has a width of 0.15 mm to 1.0 mm along a direction from an adjacent one of the dielectric member located at one side of a corresponding one of the metal sheet to another adjacent one of the dielectric member located at an opposite side of the corresponding one of the metal sheet.

13. The electronic device of claim 10, wherein the dielectric member is made of resin, rubber, or ceramic.

14. The electronic device of claim 10, wherein the metal base is made of material selected from a group consisting of aluminum, aluminum alloy, magnesium, magnesium alloy, titanium, titanium alloy, copper and copper alloy.

15. The electronic device of claim 10, wherein the non-conductive member is selected from a group consisting of polybutylene terephthalate, polyphenylene sulfide, polyethylene terephthalate, polyether ether ketone, polycarbonate, polyvinyl chloride polymer, polyurethane resin, epoxy, and polyurea resin.

16. The electronic device of claim 10, wherein a length of each of the plurality of metal sheets is equal to a width of the housing.

17. The electronic device of claim 10, wherein the non-conductive member is a U-shaped sheet.

18. The electronic device of claim 17, wherein a width of the non-conductive member is larger than a total width of the plurality of metal sheets and the plurality of dielectric members.

* * * * *